US009922899B2

(12) United States Patent
Harikai et al.

(10) Patent No.: US 9,922,899 B2
(45) Date of Patent: *Mar. 20, 2018

(54) METHOD OF MANUFACTURING ELEMENT CHIP AND ELEMENT CHIP

(71) Applicant: Panasonic Intellectual Property Management Co., Ltd., Osaka (JP)

(72) Inventors: Atsushi Harikai, Osaka (JP); Shogo Okita, Hyogo (JP); Noriyuki Matsubara, Osaka (JP); Mitsuru Hiroshima, Osaka (JP); Mitsuhiro Okune, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/408,718

(22) Filed: Jan. 18, 2017

(65) Prior Publication Data

US 2017/0229366 A1 Aug. 10, 2017

(30) Foreign Application Priority Data

Feb. 4, 2016 (JP) ................................. 2016-019869

(51) Int. Cl.
*H01L 23/31* (2006.01)
*H01L 21/78* (2006.01)
*H01L 23/544* (2006.01)
*H01L 21/3065* (2006.01)
(Continued)

(52) U.S. Cl.
CPC ...... *H01L 23/3178* (2013.01); *H01L 21/0212* (2013.01); *H01L 21/02274* (2013.01); *H01L 21/3065* (2013.01); *H01L 21/78* (2013.01); *H01L 23/3185* (2013.01); *H01L 23/544* (2013.01); *H01L 23/293* (2013.01); *H01L 2223/5446* (2013.01)

(58) Field of Classification Search
USPC .......................................................... 257/620
See application file for complete search history.

(56) References Cited

U.S. PATENT DOCUMENTS 7,776,649 B1 * 8/2010 Fan ..................... H01L 23/3114
257/E21.001
2004/0201926 A1 * 10/2004 Hancer ................ G11B 5/5552
360/294.4
2006/0038206 A1 * 2/2006 Shimoyama ........ H01L 21/6835
257/273

FOREIGN PATENT DOCUMENTS

JP 2002-093752 A 3/2002

* cited by examiner

*Primary Examiner* — Marcos D Pizarro
*Assistant Examiner* — Lawrence Tynes, Jr.
(74) *Attorney, Agent, or Firm* — Pearne & Gordon LLP

(57) ABSTRACT

In a plasma processing step that is used in the method of manufacturing the element chip for manufacturing a plurality of element chips by dividing a substrate having a plurality of element regions, the substrate is divided into the element chips by exposing the substrate to first plasma. Therefore, the element chips having a first surface, a second surface, and a side surface on which a plurality of convex portions are formed are held spaced from each other on a carrier. A protection film is formed on the side surface of the element chip by exposing the element chip to second plasma, at least convex portions formed on the side surface are covered by the protection film in the protection film formation, and creep-up of a conductive material to the side surface is suppressed in the mounting step.

13 Claims, 9 Drawing Sheets

(51) Int. Cl.
*H01L 21/02* (2006.01)
*H01L 23/29* (2006.01)

Arrow VB-VB

METHOD OF MANUFACTURING ELEMENT CHIP AND ELEMENT CHIP

BACKGROUND

1. Technical Field

The present disclosure relates to a method of manufacturing an element chip in which element chips are manufactured by dividing a substrate having a plurality of element regions for each element region and an element chip.

2. Description of the Related Art

An element chip such as a semiconductor element is manufactured by dividing a wafer substrate having a plurality of element regions into individual pieces (for example, see PTL 1). In the related art illustrated in PTL 1, first, a back surface of a wafer is polished and the wafer is thinned by etching in a state where a front surface of the wafer is stuck to a back grinding tape. Thereafter, a resist layer is formed in a portion corresponding to the element region for masking, and the wafer is subjected to plasma etching, thereby separating the wafer into individual pieces of the semiconductor elements.

CITATION LIST

Patent Literature

PTL 1: Japanese Patent Unexamined Publication No. 2002-93752

SUMMARY

An individual piece of the element chip that is cut out from the wafer substrate in the above-described manner is not only used as a device after being packed but also may be sent to an electronic component mounting step in a form of the element chip as it is as in a case of a Wafer Level Chip Size Package (WLCSP) or the like. In such a case, the element chip is mounted in a manner in which a circuit-formed surface comes directly into contact with a conductive material such as cream solder or silver paste for bonding.

An object of the disclosure is to provide a method of manufacturing an element chip in which creep-up of a conductive material in a mounting step can be suppressed and an element chip.

A method of manufacturing an element chip of the disclosure, in which a plurality of element chips are formed by dividing a substrate, which includes a first surface having a plurality of element regions defined by dividing regions, and a second surface on a side opposite to the first surface, into the dividing regions, has the following features. The method of manufacturing the element chip includes a preparing step and a plasma processing step that is performed after the preparing step. A preparing step is a step of preparing the substrate in which the first surface side of the substrate is supported on a carrier and an etching-resistant layer is formed so as to cover regions of the second surface opposite to the element regions and to expose regions of the second surface opposite to the dividing regions. A plasma processing step is a step of executing plasma processing on the substrate that is supported on a carrier and includes a dividing step, and a protection film forming step that is executed after the dividing step. The dividing step is performed to divide the substrate into the element chips by etching the substrate of regions which are not covered by the etching-resistant layer in a depth direction of the substrate up to the first surface by exposing the second surface to first plasma. Therefore, the element chips including the first surface, the second surface, and a side surface which connects the first surface and the second surface, and on which a plurality of convex portions are formed are in a state of being held spaced from each other on the carrier. The protection film forming step is performed to form the protection film on the side surface of one or more of the element chips by exposing the element chips to second plasma in a state where the element chips are held spaced from each other on the carrier. In the protection film forming step, the protection film covers at least convex portions.

A method of manufacturing an element chip of the disclosure is a method of manufacturing an element chip, in which a plurality of element chips are formed by dividing a substrate including a first surface having a plurality of element regions that are defined by dividing regions and a second surface on a side opposite to the first surface into the dividing regions, and has the following features. The method of manufacturing the element chip includes a preparing step and a plasma processing step that is performed after the preparing step. The preparing step is a step of preparing the substrate in which a second surface side is supported on a carrier and an etching-resistant layer is formed so as to expose dividing regions. The plasma processing step is a step of performing plasma processing on the substrate that is supported on the carrier and includes a dividing step and the protection film forming step that is performed after the dividing step. The dividing step is performed to divide the substrate into the element chips by etching the substrate of regions which are not covered by the etching-resistant layer in a depth direction of the substrate up to the second surface by exposing the first surface to first plasma. Therefore, the element chips including the first surface, the second surface, and a side surface which connects the first surface and the second surface, and on which a plurality of convex portions are formed are in a state of being held spaced from each other on the carrier. The protection film forming step is performed to form a protection film on the side surface of one or more of the element chips by exposing the element chips to second plasma in a state where the element chips are held spaced from each other on the carrier after the dividing step. In the protection film forming step, the protection film covers at least convex portions.

An element chip of the disclosure is an element chip including a first surface having element regions, a second surface on a side opposite to the first surface, and a side surface connecting the first surface and the second surface, in which a plurality of convex portions are formed on the side surface, and at least convex portions of the side surface are covered by a protection film.

According to the disclosure, it is possible to suppress creep-up of a conductive material in the mounting step.

DETAILED DESCRIPTION

Prior to the description of an embodiment of the disclosure, problems in the device of the related art will be briefly described.

As described above, in a case where the element chip such as the WLCSP is sent to an electronic component mounting step as it is, the element chip is mounted in a manner in which the circuit-formed surface comes directly into contact with the conductive material such as cream solder or silver paste for bonding. In the mounting step, the conductive material that is pressed and expanded during mounting the element chip is spread not only on the bonding portion of the circuit-formed surface but also on a side surface or a back surface of the element chip, that is, a so-called "creep-up" may occur. The creep-up of the conductive material causes various problems such as causing short-circuit between adjacent electrodes and an increase in current consumption by forming an unnecessary electric circuit on the side surface of the element chip. Therefore, it is required to suppress the creep-up of the conductive material in the mounting step.

Next, an embodiment of the disclosure will be described with reference to the drawings.

First Example

First, a first example in a method of manufacturing an element chip of the embodiment will be described with reference to FIGS. 1A to 1C and 2A to 2C. Here, the method of manufacturing the element chip is configured such that a plurality of element chips are formed by dividing a substrate including a first surface having a plurality of element regions that are defined by dividing regions and a second surface on a side opposite to the first surface into the dividing regions.

Figure 1A:
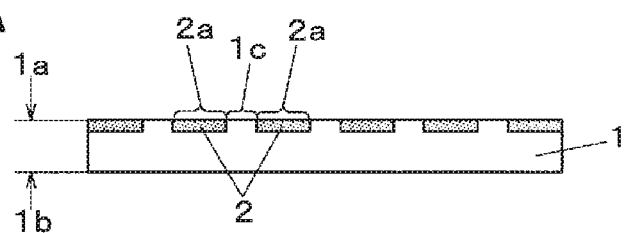
FIG. 1A is an explanatory view of a step of a first example in a method of manufacturing an element chip of an embodiment of the disclosure.

As illustrated in FIG. 1A, substrate 1 is a wafer substrate where a plurality of element chips 10 (see FIG. 1C) having element portions 2 are created. A plurality of element regions 2a defined by dividing regions 1c are set in first surface 1a in substrate 1 that is an element surface in which an element portion 2 is formed. Substrate 1 is sent to a preparing step for manufacturing the element chip and, as described below, the support thereof by carrier 4 and the mask formation are performed. As carrier 4, a dicing tape that is held by a dicing frame or a support substrate that includes adhesive layer in holding surface 4a may be exemplified.

Figure 1B:
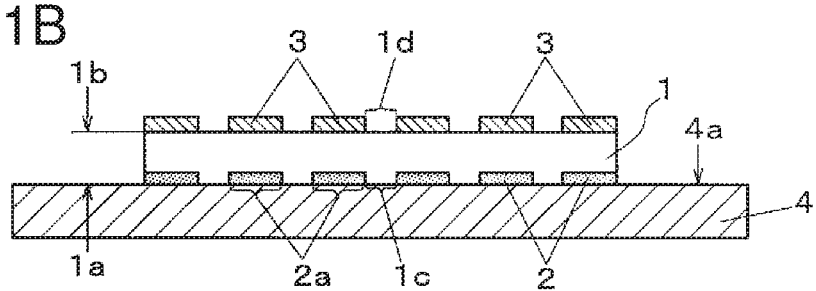
FIG. 1B is an explanatory view of a step of the first example in the method of manufacturing the element chip of an embodiment of the disclosure.

In the preparing step, as illustrated in FIG. 1B, etching-resistant layer 3 that functions as a mask in plasma dicing is formed in second surface 1b. That is, etching-resistant layers 3 are formed in second surface 1b so as to cover regions of second surface 1b facing element regions 2a and expose regions 1d of second surface 1b facing dividing regions 1c. First surface 1a side of substrate 1 is supported on holding surface 4a of carrier 4. In the preparing step, the mask formation may be performed before being supported by carrier 4 or after being supported by carrier 4.

Figure 3:
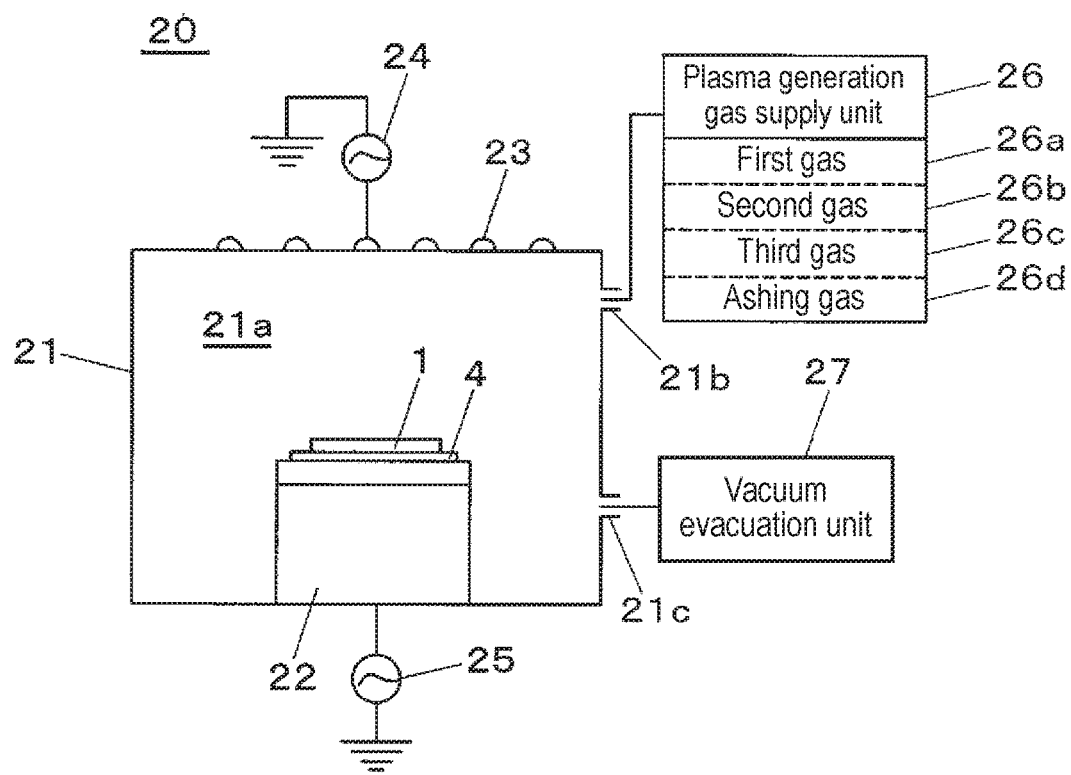
FIG. 3 is an explanatory view of a configuration of a plasma etching device that is used in the method of manufacturing the element chip of an embodiment of the disclosure.

After performing the preparing step as described above, in order to perform plasma processing on substrate 1 that is supported on carrier 4, carrier 4 is sent to a plasma processing step. A configuration of plasma etching device 20 that is used in the plasma processing step will be described with reference to FIG. 3. In FIG. 3, an inside of chamber 21 that is a vacuum vessel is processing chamber 21a for performing plasma processing and stage 22, on which carrier 4 supporting substrate 1 that is to be processed is mounted, is disposed on a bottom portion of processing chamber 21a. Antennas 23 as upper electrodes are disposed on an upper surface of a top portion of chamber 21 and antenna 23 is electrically connected to first high-frequency power supply unit 24. Stage 22 within processing chamber 21a also has a function as a lower electrode for performing plasma processing and stage 22 is electrically connected to second high-frequency power supply unit 25.

Vacuum evacuation unit 27 is connected to chamber 21 via exhaust port 21c and the inside of processing chamber 21a is evacuated by driving vacuum evacuation unit 27. Furthermore, plasma generation gas supply unit 26 is connected to processing chamber 21a via gas inlet port 21b. In plasma etching device 20 illustrated in the embodiment, it is possible to selectively supply a plurality of types of plasma generation gas depending on the purpose of plasma processing. Here, as the types of plasma generation gas, first gas 26a, second gas 26b, third gas 26c, and ashing gas 26d may be selected.

As first gas 26a, gas such as $SF_6$ which is excellent in etching effect for silicon as a target is used. In the embodiment, first gas 26a is used for generating first plasma P1 to divide substrate 1 by plasma etching. As second gas 26b, gas containing fluorocarbon such as $C_4F_8$, $C_2F_6$, $CF_4$, $C_6F_6$, $C_6F_4H_2$, $CHF_3$, and $CH_2F_2$ is used. These types of gas are used as gas for a plasma CVD that forms a film using a plasma processing and, in the embodiment, are used for the purpose of forming a protection film on a side surface of element chips 10 that are obtained by dividing substrate 1.

As third gas 26c, gas which is excellent in physical etching effect such as $SF_6$ gas, oxygen gas, and argon gas is used. In the embodiment, third gas 26c is used for sputtering for removing an unnecessary portion among the protection film described above. Ashing gas 26d is oxygen gas and, in the embodiment, is used for the purpose of removing a resist film such as etching-resistant layer 3 after completion of a mask function.

In plasma processing by plasma etching device 20, first, substrate 1 to be processed is mounted on stage 22 together with carrier 4 and the inside of processing chamber 21a is excavated to be vacuum by driving vacuum evacuation unit 27. At the same time, plasma generation gas depending on the purpose of plasma processing is supplied on the inside of processing chamber 21a by plasma generation gas supply unit 26 and the inside of processing chamber 21a is maintained at a predetermined pressure. In this state, high-frequency power is supplied on antenna 23 by first high-frequency power supply unit 24 and thereby plasma according to the type of plasma generation gas, which is supplied, is generated on the inside of processing chamber 21a. In this case, a bias voltage is applied to stage 22 as the lower electrode by second high-frequency power supply unit 25. Therefore, it is possible to exert a biasing effect for promoting entry of plasma generated on the inside of processing chamber 21a in a direction of stage 22 and to perform anisotropic etching by enhancing a plasma processing effect in a desired specific direction.

Figure 1C:
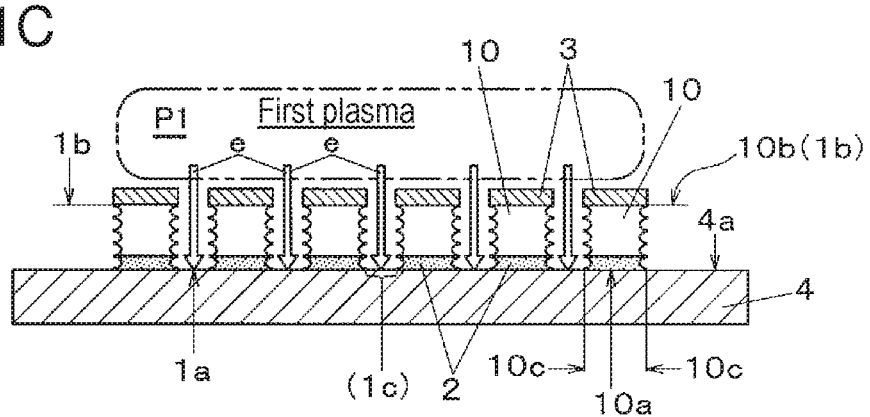
FIG. 1C is an explanatory view of a step of the first example in the method of manufacturing the element chip of an embodiment of the disclosure.

In the plasma processing step, first, processing is executed by first plasma P1 using first gas 26a described above. As illustrated in FIG. 1C, substrate 1 of regions 1d (see FIG. 1B) which are not covered by etching-resistant layer 3 are etched (see arrows e) until reaching first surface 1a in the depth direction of substrate 1 by exposing second surface 1b of substrate 1 to first plasma P1 described above. Etching grooves 11 (see FIG. 2A) separating each element chip 10 are formed, and substrate 1 is divided into element chips 10 of individual pieces. That is, element chips 10 including first surface 10a that is first surface 1a, second surface 10b that is second surface 1b in the state of substrate 1, and side surface 10c connecting first surface 10a and second surface 10b are in a state of being held spaced from each other on carrier 4 (dividing step).

Etching conditions in the dividing step can be appropriately selected depending on a material of substrate 1. In a case where substrate 1 is a silicon substrate, for etching in the dividing step, a so-called Bosch process can be used. In a Bosch process, a silicon etching step of etching silicon forming substrate 1, a deposition film depositing step of depositing the deposition film on an inner wall of a portion that is etched by the silicon etching step, and a deposition film etching step of etching the deposition film that is deposited are sequentially repeated. Therefore, it is possible to vertically burrow region 1d that is not covered by etching-resistant layer 3 in a depth direction of the substrate.

Figure 4A:
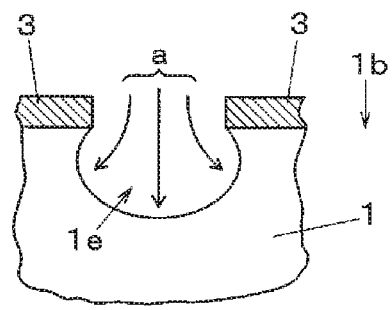
FIG. 4A is an explanatory view of an etching groove forming step in a method of manufacturing an element chip of an embodiment of the disclosure.

A forming process of etching groove 11 by the Bosch process will be described with reference to FIGS. 4A to 4D. FIG. 4A illustrates plasma etching in the silicon etching step. That is, removed portion 1e of a substantially elliptical cross section is formed by an isotropic etching action by the first plasma (arrow a) in a region that is not covered by etching-resistant layer 3 in second surface 1b by exposing second surface 1b of substrate 1 to first plasma P1. As conditions of the silicon etching step, for example, the pressure on the inside of processing chamber 21a is adjusted to 5 to 15 Pa while supplying $SF_6$ at 200 to 400 sccm as raw material gas, input power from first high-frequency power supply unit 24 to antenna 23 is 1500 to 2500 W, input power from second high-frequency power supply unit 25 to the lower electrode is 50 to 200 W, and a processing time may be 10 to 20 seconds. Here, sccm is a unit indicating the amount of flow of a gas. That is, 1 sccm indicates the amount of flow of a gas that flows by 1 $cm^3$ per minute at 0° C. and 1 atmosphere (standard condition).

Figure 4B:
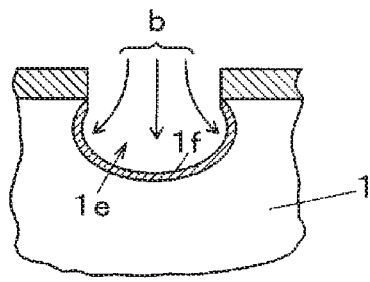
FIG. 4B is an explanatory view of the etching groove forming step in the method of manufacturing the element chip of an embodiment of the disclosure.

Next, plasma processing for the deposition film depositing step is executed. That is, as illustrated in FIG. 4B, deposition film 1f is formed on the inner surface of removed portion 1e by exposing the inside of removed portion 1e to plasma (arrow b) for depositing the deposition film. As conditions of the deposition film depositing step, for example, the pressure on the inside of processing chamber 21a is adjusted to 15 to 25 Pa while supplying $C_4F_8$ at 150 to 250 sccm as raw material gas, input power from first high-frequency power supply unit 24 to antenna 23 is 1500 to 2500 W, input power from second high-frequency power supply unit 25 to the lower electrode is 0 W, and a processing time may be 5 to 15 seconds.

Figure 4C:
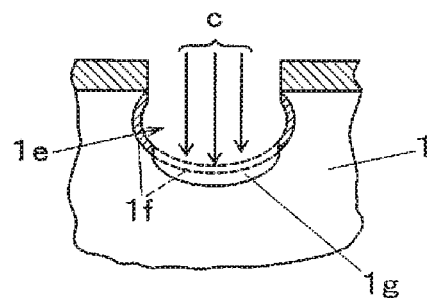
FIG. 4C is an explanatory view of the etching groove forming step in the method of manufacturing the element chip of an embodiment of the disclosure.

Next, the deposition film etching step is executed. That is, as illustrated in FIG. 4C, deposition film 1f of a region is removed by the anisotropic etching by operating plasma (arrow c) for the deposition film etching only in deposition film 1f of the region that is positioned on a lower surface on the inside of removed portion 1e. Therefore, a partially removed portion 1g in which silicon is exposed is formed on the bottom surface of removed portion 1e. As conditions of the deposition film etching step, for example, the pressure on the inside of processing chamber 21a is adjusted to 5 to 15 Pa while supplying $SF_6$ as raw material gas at 200 to 400 sccm, input power from first high-frequency power supply unit 24 to antenna 23 is 1500 to 2500 W, input power from second high-frequency power supply unit 25 to the lower electrode is 100 to 300 W, and the processing time may be 2 to 10 seconds.

Figure 4D:
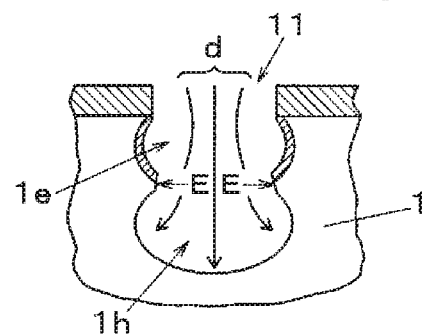
FIG. 4D is an explanatory view of the etching groove forming step in the method of manufacturing the element chip of an embodiment of the disclosure.

Thereafter, the silicon etching step is executed again on target substrate 1 after the partially removed portion 1g is formed. That is, as illustrated in FIG. 4D, the partially removed portion 1g that is formed in the deposition film etching step is exposed by the first plasma (arrow d) similar to FIG. 4A. Therefore, removed portion 1h of a substantially elliptical cross section communicating with the bottom surface of removed portion 1e is formed by the isotropic etching action by the first plasma (arrow d). Therefore, it is possible to burrow the silicon substrate at a speed of 10 μm/min by repeating the silicon etching step, the deposition film depositing step, and the deposition film etching step. In this case, convex portion E protruding from the inner wall surface (side surface 10c in a case where substrate 1 is divided into element chips 10) of etching groove 11 is formed in a boundary portion in which removed portion 1e transits to next removed portion 1h.

Figure 5A:
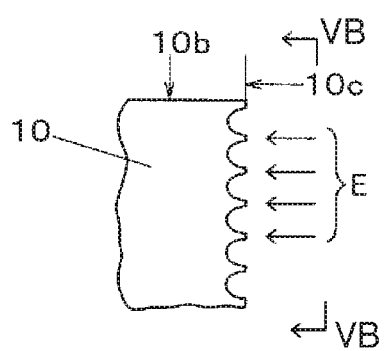
FIG. 5A is an explanatory view of a side surface shape of an element chip in the method of manufacturing the element chip of an embodiment of the disclosure.
Figure 5B:
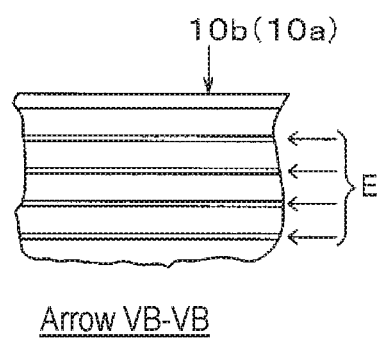
FIG. 5B is an explanatory view of the side surface shape of the element chip in the method of manufacturing the element chip of an embodiment of the disclosure.

That is, in the plasma processing step illustrated in the embodiment, the dividing step described above has a form having a repeating step of the silicon etching step of etching substrate 1 the deposition film depositing step of depositing the deposition film on the inner wall of the portion that is etched by the silicon etching step. FIGS. 5A and 5B illustrate a formation form of a plurality of convex portions E that are formed in the repeating step.

That is, one convex portion E are formed for each repeating step and, in the dividing step, as illustrated in FIG. 5A, the plurality of convex portions E are formed on side surface 10c of element chip 10. FIG. 5B illustrates a portion viewed in arrow VB-VB in FIG. 5A and the plurality of convex portions E are formed on side surface 10c of element chip 10 like a plurality of lines along second surface 10b (or first surface 10a parallel to second surface 10b).

Figure 2A:
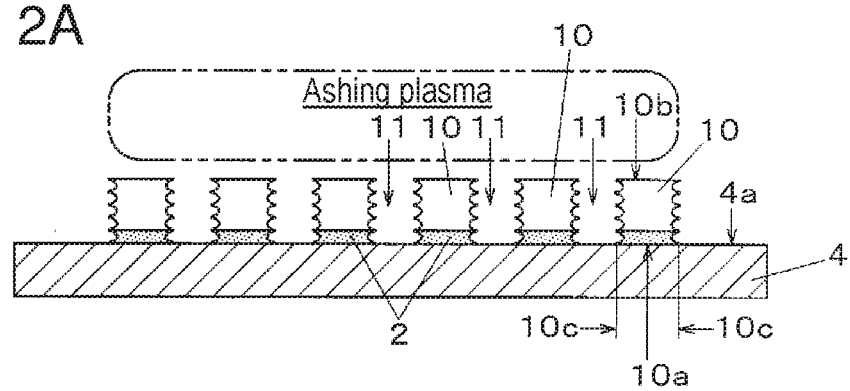
FIG. 2A is an explanatory view of a step of the first example in the method of manufacturing the element chip of an embodiment of the disclosure.

Thereafter, ashing for removing etching-resistant layer 3 of a state of covering second surface 10b is performed in element chip 10 of individual piece. That is, as illustrated in FIG. 2A, ashing plasma is generated by using ashing gas 26d on the inside of processing chamber 21a in plasma etching device 20. Etching-resistant layer 3 containing mainly resin is removed by the ashing. Therefore, second surfaces 10b of element chips 10 that are divided into individual pieces are in a state of being exposed.

Etching conditions in the dividing step can be appropriately selected depending on a material of etching-resistant layer 3. For example, in a case where etching-resistant layer 3 is a resist film, the pressure on the inside of processing chamber 21a is adjusted to 5 to 15 Pa while supplying oxygen at 150 to 250 sccm and supplying $CF_4$ at 0 to 50 sccm as raw material gas, input power from first high-frequency power supply unit 24 to antenna 23 is 1500 to 2500 W, input power from second high-frequency power supply unit 25 to the lower electrode may be 0 to 30 W. In the conditions, it is possible to remove etching-resistant layer 3 at a speed of appropriately 1 μm/min.

Figure 2B:
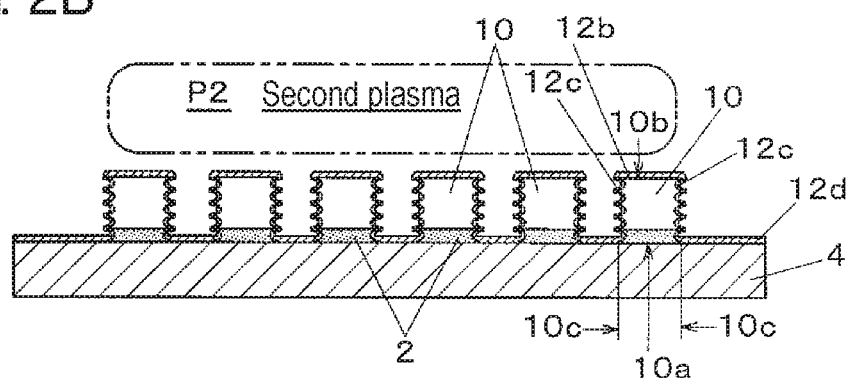
FIG. 2B is an explanatory view of a step of the first example in the method of manufacturing the element chip of an embodiment of the disclosure.

Next, after the dividing step described above, a protection film forming step is performed. That is, in plasma etching device 20, second plasma P2 using second gas 26b that is gas containing fluorocarbon is generated on the inside of processing chamber 21a and, as illustrated in FIG. 2B, element chips 10 are exposed to second plasma P2 in a state of being held spaced from each other on carrier 4. Therefore, protection films 12b and 12c are respectively formed on second surface 10b and side surface 10c of element chip 10.

Therefore, at the same time, protection film 12d having the same compositions is also adhered to the upper surface of carrier 4.

Protection films are formed for the purpose of suppressing creep-up of the conductive material in the mounting process for directly bonding element chip 10 to the package substrate and the like. Therefore, it is preferable that the protection films have less hygroscopicity and dense composition. In the embodiment, as raw material gas of second plasma P2 used for forming the protection films, since gas containing fluorocarbon is used, it is possible to form the protection films which contain mainly fluorocarbon containing fluorine and carbon and have less hygroscopicity and dense composition. In the protection film forming step, the high-frequency bias is applied to stage 22 (see FIG. 3) on which carrier 4 is mounted. Therefore, incidence of ions into element chip 10 is promoted and it is possible to form the protection film having more dense composition and high adhesion.

As conditions of the protection film formation, for example, the pressure on the inside of processing chamber 21a is adjusted to 15 to 25 Pa while supplying $C_4F_8$ at 150 sccm and He at 50 sccm as raw material gas, input power from first high-frequency power supply unit 24 to antenna 23 is 1500 to 2500 W, input power from second high-frequency power supply unit 25 to the lower electrode may be 50 to 150 W. In the conditions, it is possible to form the protection film having a thickness of 3 μm by being processed for 300 seconds.

In the embodiment, as raw material gas, mixed gas of fluorocarbon and helium is used and this is because dissociation of raw material gas is promoted in plasma by mixing helium and, as a result, it is possible to form the protection film which is dense and has high adhesion.

In the condition examples described above, the ratio of the flow ratio of He to the total flow rate of raw material gas is 25%(=50/(150+50)×100). As described below, it is preferable that the ratio is between 10% and 80%. That is, if the ratio of the flow ratio of He to the total flow rate of raw material gas is greater than 10%, the dissociation of raw gas is easily facilitated in the plasma and, as a result, it is possible to form the protection film which is further dense and has high adhesion. On the other hand, if the ratio of the flow ratio of He to the total flow rate of raw material gas is greater than 80%, the ratio of $C_4F_8$ occupied in raw material gas is reduced. Therefore, supply of components (C, F, and compounds thereof) in plasma contributing to the protection film formation to the surface of the substrate is insufficient, a deposition rate of the protection film on the surface of the substrate is slow, and productivity is lowered.

Figure 6:
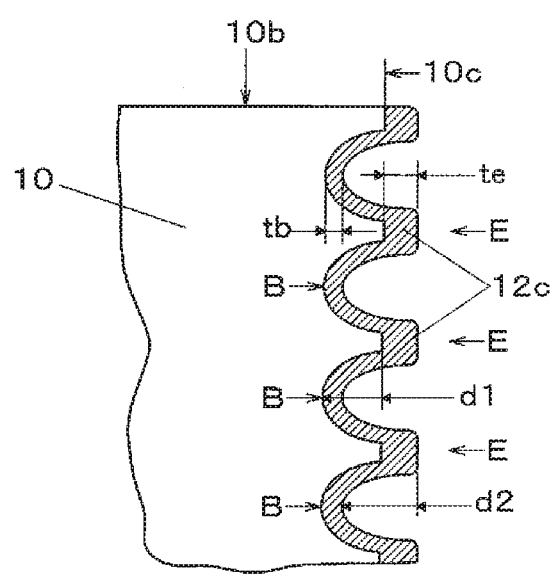
FIG. 6 is an explanatory view of a side surface shape of the element chip in the method of manufacturing the element chip of an embodiment of the disclosure.

FIG. 6 illustrates details of the shape of protection film 12c that is formed by covering the plurality of convex portions E formed in side surface 10c illustrated in FIGS. 5A and 5B. As illustrated in FIG. 6, protection film 12c is formed so as to cover at least convex portion E among side surface 10c. Protection film 12c is formed such that a film thickness to of protection film 12c covering convex portion E is greater than a film thickness tb in an intermediate (here, bottom portion B of a concave portion formed between convex portions E) of adjacent two convex portions E.

That is, protection film 12c is formed such that a step d2 between a top portion of protection film 12c covering convex portion E and a surface of protection film 12c covering bottom portion B is greater than step d1 between the top portion of convex portion E and bottom portion B of the concave portion in side surface 10c. Therefore, the step between convex portion E and bottom portion B is increased in side surface 10c after the protection film formation. Therefore, a substantial surface area of side surface 10c is increased and it is possible to improve suppressing effect of the creep-up of the conductive material in the mounting process of element chip 10.

Next, the protection film removing step is executed for removing an unnecessary portion among the protection film formed in the protection film forming step. In the protection film forming step described above, protection film 12b is also formed in second surface 10b together with side surface 10c of element chip 10 (see FIG. 2B). Since protection film 12b is not necessary, plasma processing for third plasma P3 is executed for removing protection film 12b.

Figure 2C:
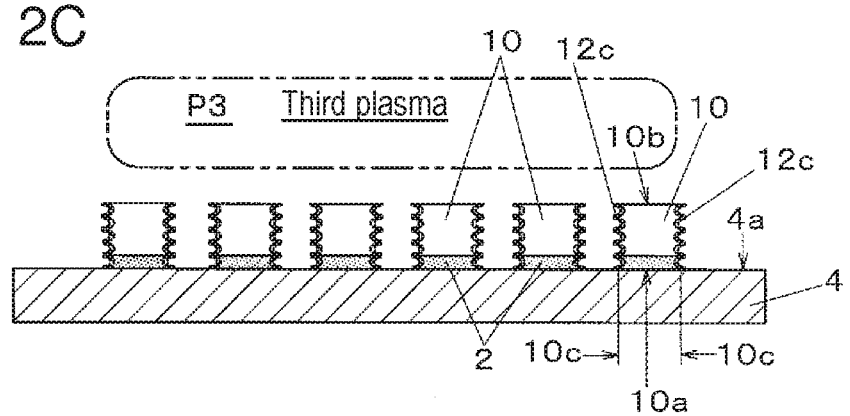
FIG. 2C is an explanatory view of a step of the first example in the method of manufacturing the element chip of an embodiment of the disclosure.

That is, in plasma etching device 20, third plasma P3 using third gas 26c containing argon gas or oxygen gas as a component is generated on the inside of processing chamber 21a and, as illustrated in FIG. 2C, element chip 10 is exposed by third plasma P3 in a state of being held spaced from each other on carrier 4. Therefore, protection film 12c formed on side surface 10c of element chip 10 is left and protection film 12b formed on second surface 10b exposed on the upper surface in element chip 10 is removed by the etching operation of third plasma P3. Therefore, second surface 10b and side surface 10c of element chips 10 that are held spaced from each other on carrier 4 are in a state of being exposed and protection film 12d adhered the upper surface of carrier 4 is also removed.

In the protection film removing step described above, the high-frequency bias is applied to the stage on which carrier 4 is mounted. Therefore, it is possible to increase the anisotropy of the etching operation of third plasma P3. Therefore, protection film 12b of second surface 10b that is exposed on the upper surface is reliably removed, the etching operation acting on protection film 12c of side surface 10c of element chip 10 is suppressed, and thereby it is possible to leave protection film 12c.

As conditions of removing of the protection film, for example, the pressure on the inside of processing chamber 21a is adjusted to 0.2 to 1.5 Pa while supplying Ar at 150 to 250 sccm and $O_2$ at 0 to 150 sccm as raw material gas, input power from first high-frequency power supply unit 24 to antenna 23 is 1500 to 2500 W, input power from second high-frequency power supply unit 25 to the lower electrode may be 150 to 300 W. In the conditions, it is possible to etch the protection film exposed to the upper surface at a speed of appropriately 0.5 μm/min.

Second Example

Next, a second example in the method of manufacturing the element chip of the embodiment will be described with reference to FIGS. 7A to 7C and 8A to 8C. Here, the method of manufacturing the element chip illustrated in the second example is configured similar to that of the first example in which a plurality of element chips are formed by dividing a substrate, which includes a first surface having a plurality of element regions that are defined into dividing regions and a second surface on a side opposite to the first surface, into the dividing regions.

Figure 7A:
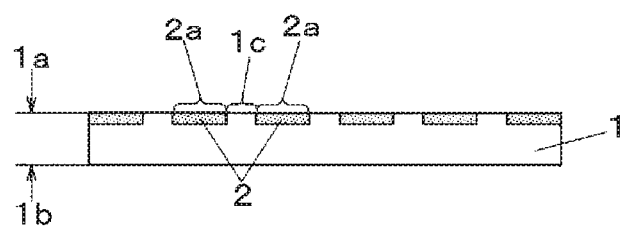
FIG. 7A is an explanatory view of a step of a second example in a method of manufacturing an element chip of an embodiment of the disclosure.

As illustrated in FIG. 7A, substrate 1 is a wafer substrate in which a plurality of element chips 10 (see FIG. 7C) having element portions 2 are created. A plurality of element regions 2a that are defined by dividing regions 1c are set in first surface 1a that is an element surface on which element portions 2 are formed in substrate 1. Substrate 1 is sent to a preparing step for manufacturing the element chips and, in here, the mask formation and support thereof by carrier 4 are performed as described below. Similar to the first example, as carrier 4, a carrier is capable of being handled by fixing substrate 1 which is thin and easily bent such as an adhesive sheet or a support substrate, is used.

Figure 7B:
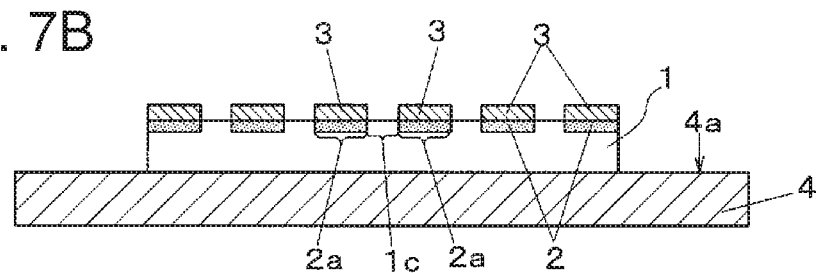
FIG. 7B is an explanatory view of a step of the second example in the method of manufacturing an element chip of an embodiment of the disclosure.

In the preparing step, as illustrated in FIG. 7B, etching-resistant layer 3 functioning as a mask in plasma dicing is formed in first surface 1a. That is, etching-resistant layer 3 is formed on first surface 1a so as to cover the element region 2a and expose dividing regions 1c. A second surface 1b side of substrate 1 is supported on holding surface 4a of carrier 4. The mask formation in the preparing step may be performed before being supported by carrier 4 or may be performed after being supported by carrier 4.

Therefore, since plasma processing is performed on substrate 1 supported by carrier 4 after performing the preparing step, carrier 4 is sent to the plasma processing step. In the plasma processing step, plasma etching device 20 (see FIG. 3) described in the first example is used.

Figure 7C:
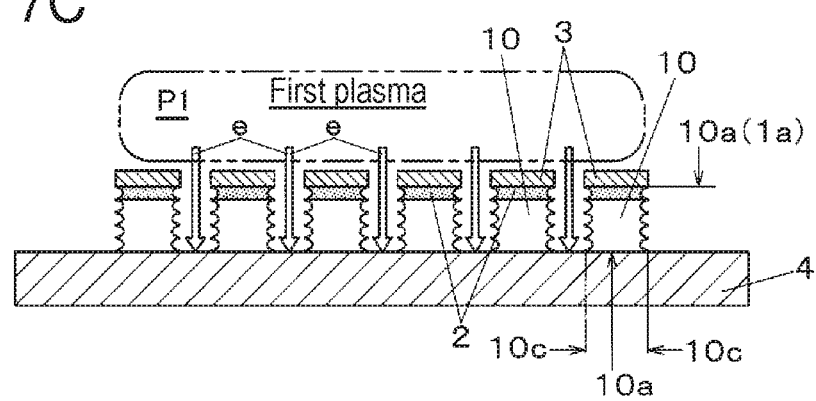
FIG. 7C is an explanatory view of a step of the second example in the method of manufacturing an element chip of an embodiment of the disclosure.

In the plasma processing step, first, processing by first plasma P1 is executed by using first gas 26a. As illustrated in FIG. 7C, etching grooves 11 (see FIG. 8A) separated from each other between element chips 10 are formed and substrate 1 is divided into element chips 10 of individual pieces by etching (see arrow e) substrate 1 of dividing regions 1c (see FIG. 7C) which are not covered by etching-resistant layer 3 in a depth direction of substrate 1 up to second surface 1b by exposing first surface 1a of substrate 1 to first plasma P1. That is, element chip 10 including first surface 10a that is first surface 1a in a state of substrate 1, second surface 10b that is second surface 1b, and side surface 10c connecting first surface 10a and second surface 10b is in a state of being held spaced from each other on carrier 4 (dividing step).

In the dividing step, similar to the first example, the etching step of etching substrate 1 and the deposition film depositing step of depositing the deposition film on the inner wall of the portion that is etched by the etching step are alternately repeated (repeating step). Therefore, in the repeating step, similar to the first example, convex portions E are formed on side surface 10c of element chip 10 like a plurality of lines along first surface 10a.

Figure 8A:
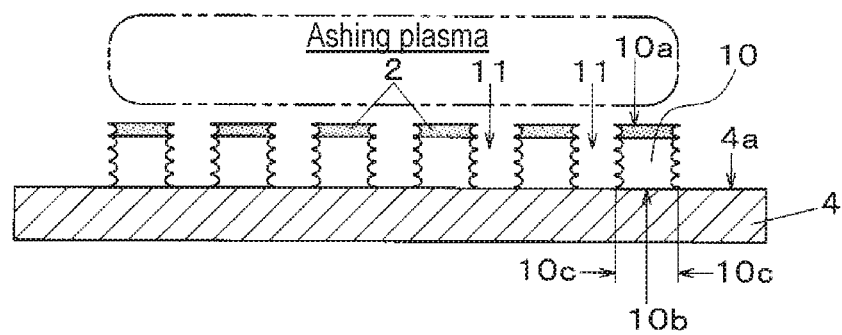
FIG. 8A is an explanatory view of a step of the second example in the method of manufacturing an element chip of an embodiment of the disclosure.

Thereafter, ashing for removing etching-resistant layer 3 of a state of covering second surface 10b is performed in element chip 10 of individual piece. That is, as illustrated in FIG. 8A, ashing plasma is generated by using ashing gas 26d on the inside of processing chamber 21a in plasma etching device 20. Etching-resistant layer 3 containing mainly resin is removed by the ashing. Therefore, second surfaces 10b of element chips 10 that are divided into individual pieces are in a state of being exposed.

Figure 8B:
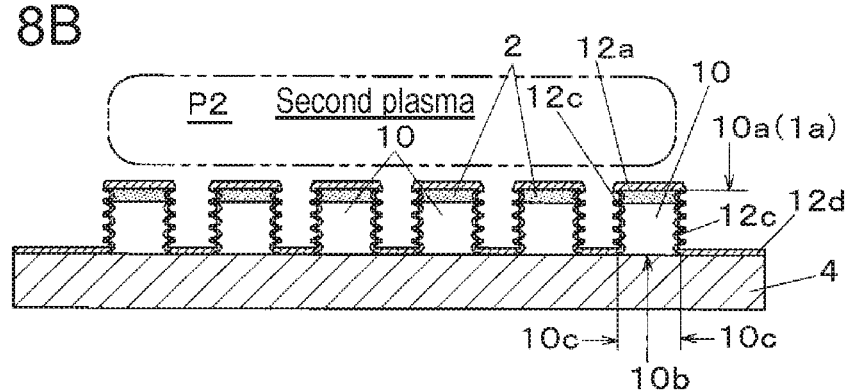
FIG. 8B is an explanatory view of a step of the second example in the method of manufacturing an element chip of an embodiment of the disclosure.

Next, the protection film forming step is executed after the dividing step described above. That is, in plasma etching device 20, second plasma P2 using second gas 26b containing fluorocarbon is generated on the inside of processing chamber 21a and, as illustrated in FIG. 8B, in a state where element chips 10 are held spaced from each other on carrier 4, element chips 10 are exposed by second plasma P2. Therefore, protection films 12a and 12c are formed in predetermined portions of first surface 10a and side surface 10c of element chip 10.

In the protection film forming step, details (see FIGS. 5A and 5B) of the shape of protection film 12c formed on side surface 10c by covering the plurality of convex portions E, advantages, and effects are the same as those of the first example. In the formation of the protection films, as raw material gas of second plasma P2, the mixed gas of fluorocarbon and helium may be used and advantages and effects accordingly are the same as those of the first example. In the protection film forming step, the high-frequency bias is applied to the stage on which carrier 4 is mounted. Therefore, the incidence of the ions on element chip 10 is promoted and it is possible to form the protection film that is denser and has high adhesion.

Figure 8C:
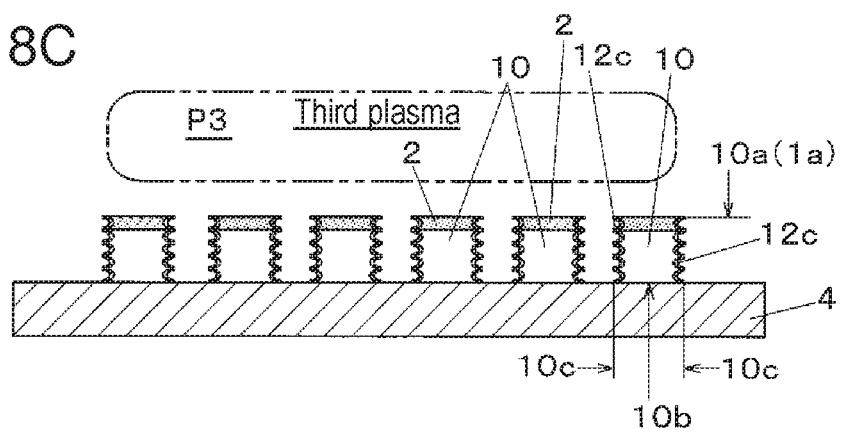
FIG. 8C is an explanatory view of a step of the second example in the method of manufacturing an element chip of an embodiment of the disclosure.

Next, the protection film removing step for removing an unnecessary portion among the protection films formed in the protection film forming step is executed. In the protection film forming step described above, protection film 12*a* is also formed on first surface 10*a* together with side surface 10*c* of element chip 10 (see FIG. 8B). Since protection film 12*a* is not necessary, plasma processing is performed using third plasma P3 for removing the film. That is, in plasma etching device 20, third plasma P3 using third gas 26*c* containing argon gas or oxygen as a component is generated on the inside of processing chamber 21*a* and, as illustrated in FIG. 8C, in a state where element chips 10 are held spaced from each other on carrier 4, element chips 10 are exposed by third plasma P3. Therefore, protection film 12*c* formed on side surface 10*c* of element chip 10 is left and protection film 12*a* formed on first surface 10*a* exposed on the upper surface in element chip 10 is removed by the etching operation of third plasma P3. Therefore, first surface 10*a* of element chips 10 that is held spaced from each other on carrier 4 is in a state of being exposed and protection film 12*d* adhered the upper surface of carrier 4 is also removed.

In the protection film removing step described above, the high-frequency bias is applied to the stage on which carrier 4 is mounted. Therefore, it is possible to increase the anisotropy of the etching operation of third plasma P3. Therefore, protection film 12*a* of first surface 10*a* that is exposed on the upper surface is reliably removed, the etching operation acting on protection film 12*c* of side surface 10*c* of element chip 10 is suppressed, and thereby it is possible to leave protection film 12*c*.

Next, variation of element chip 10 that is manufactured by the method of manufacturing the element chip illustrated in the embodiment will be described with reference to FIGS. 9A to 9D. All element chips 10 include first surface 10*a* having the element region 2*a*, second surface 10*b* on a side opposite to first surface 10*a*, and side surface 10*c* connecting first surface 10*a* and second surface 10*b*. Therefore, as illustrated in FIGS. 5A, 5B, and 6, the plurality of convex portions E are formed on side surface 10*c* and at least convex portions E of side surface 10*c* are covered by protection film 12*c*.

Figure 9A:
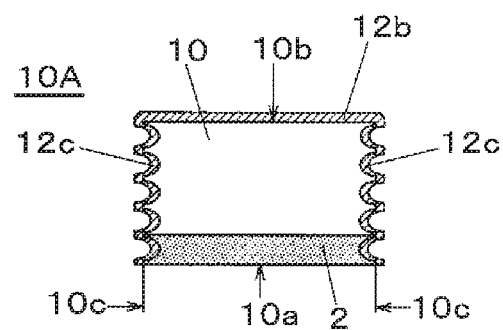
FIG. 9A is an explanatory view of a configuration of the element chip that is manufactured by the method of manufacturing the element chip of an embodiment of the disclosure.
Figure 9B:
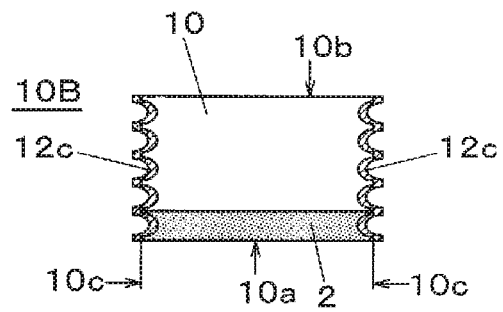
FIG. 9B is an explanatory view of the configuration of the element chip that is manufactured by the method of manufacturing the element chip of an embodiment of the disclosure.

FIGS. 9A and 9B illustrate element chip 10A and element chip 10B that are manufactured by the method of manufacturing the element chip of the first example illustrated in FIGS. 1A to 1C and 2A to 2C. That is, element chip 10A illustrated in FIG. 9A is in a state where protection film 12*b* is left on second surface 10*b* in addition to protection film 12*c* formed in side surface 10*c*. In element chip 10B illustrated in FIG. 9B, protection film 12*b* is removed from second surface 10*b*.

Figure 9C:
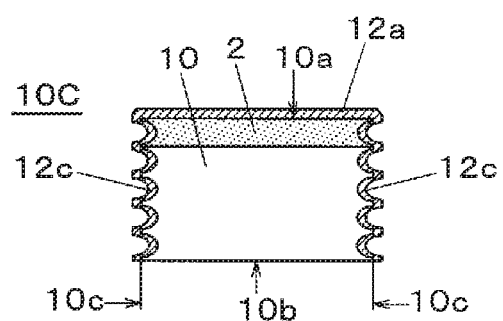
FIG. 9C is an explanatory view of the configuration of the element chip that is manufactured by the method of manufacturing the element chip of an embodiment of the disclosure.
Figure 9D:
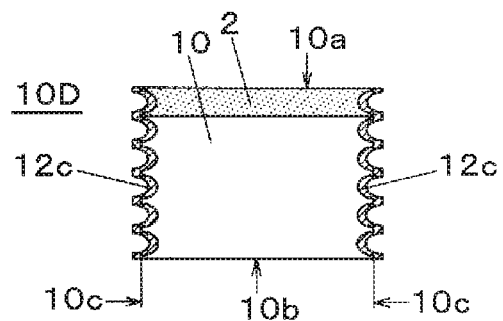
FIG. 9D is an explanatory view of a configuration of the element chip that is manufactured by the method of manufacturing the element chip of an embodiment of the disclosure.

FIGS. 9C and 9D illustrate element chip 10C and element chip 10D that are manufactured by the method of manufacturing the element chip of the second example illustrated in FIGS. 7A to 7C and 8A to 8C. Element chip 10C illustrated in FIG. 9C is in a state where protection film 12*b* is left on first surface 10*a* on the element portion 2 side in addition to protection film 12*c* formed in side surface 10*c*. In element chip 10D illustrated in FIG. 9D, protection film 12*b* is removed from first surface 10*a*.

In element chips 10A to 10D having the configuration described above, protection film 12*c*, which has surface properties suppressing spreading of a conductive adhesive material in a range in which the conductive material is in contact with at least side surface 10*c* in the mounting step, is formed. Therefore, it is possible to suppress the creep-up of the conductive material in the mounting step. In the embodiment, protection film 12*c* covering the plurality of convex portions E formed in side surface 10*c* is formed. Therefore, a substantial surface area of side surface 10*c* is increased and it is possible to improve suppressing effect of the creep-up of the conductive material in the mounting process of element chip 10.

The method of manufacturing an element chip and an element chip of the disclosure have the effect that creep-up of the conductive material can be suppressed in the mounting step and are useful in a field of manufacturing the element chips by dividing the substrate having the plurality of element regions for each of the element regions.

What is claimed is:

1. A method of manufacturing an element chip, in which a plurality of element chips are formed by dividing a substrate, which includes a first surface having a plurality of element regions defined by dividing regions, and a second surface on a side opposite to the first surface, at the dividing regions, the method comprising:
    a preparing step of preparing the substrate in which a first surface side of the substrate is supported on a carrier and an etching-resistant layer is formed so as to cover regions of the second surface opposite to the element regions and to expose regions of the second surface opposite to the dividing regions; and
    a plasma processing step of performing plasma processing on the substrate that is supported on the carrier after the preparing step,
    wherein the plasma processing step includes
    a dividing step of dividing the substrate into the element chips by etching the substrate of regions which are not covered by the etching-resistant layer in a depth direction of the substrate up to the first surface by exposing the second surface to first plasma and causing the element chips including the first surface, the second surface, and a side surface which connects the first surface and the second surface, and on which a plurality of convex portions are formed to be in a state of being held spaced from each other on the carrier, and
    a protection film forming step of forming a protection film on the side surface of one or more of the element chips by exposing the element chips to second plasma in a state where the element chips are held spaced from each other on the carrier after the dividing step, and
    wherein in the protection film forming step, the protection film covers at least the convex portions.

2. The method of manufacturing an element chip of claim 1,
    wherein the dividing step has a repeating step in which a silicon etching step of etching the substrate and a deposition film depositing step of depositing a deposition film on an inner wall of a portion of the substrate that is etched by the silicon etching step are alternately repeated, and
    wherein in the repeating step, the convex portions are formed in a plurality of lines along the first surface on the side surface.

3. The method of manufacturing an element chip of claim 1,
    wherein the protection film is a film including mainly fluorocarbon.

4. The method of manufacturing an element chip of claim 3,
wherein protection film forming gas for generating the second plasma contains fluorocarbon.

5. The method of manufacturing an element chip of claim 1,
wherein a film thickness of the protection film covering one or more of the convex portions is greater than a film thickness of the protection film in an intermediate portion of the adjacent two convex portions.

6. A method of manufacturing an element chip, in which a plurality of element chips are formed by dividing a substrate, which includes a first surface having a plurality of element regions defined by dividing regions, and a second surface on a side opposite to the first surface, at the dividing regions, the method comprising:
a preparing step of preparing the substrate in which a second surface side is supported on a carrier and an etching-resistant layer is formed so as to cover the element regions and to expose the dividing regions; and
a plasma processing step of performing plasma processing on the substrate that is supported on the carrier after the preparing step,
wherein the plasma processing step includes
a dividing step of dividing the substrate into the element chips by etching the substrate of regions which are not covered by the etching-resistant layer in a depth direction of the substrate up to the second surface by exposing the first surface to first plasma and causing the element chips including the first surface, the second surface, and a side surface which connects the first surface and the second surface, and on which a plurality of convex portions are formed to be in a state of being held spaced from each other on the carrier, and
a protection film forming step of forming a protection film on the side surface of one or more of the element chips by exposing the element chips to second plasma in a state where the element chips are held spaced from each other on the carrier after the dividing step, and
wherein in the protection film forming step, the protection film covers at least the convex portions.

7. The method of manufacturing an element chip of claim 6,
wherein the dividing step has a repeating step in which a silicon etching step of etching the substrate and a deposition film depositing step of depositing a deposition film on an inner wall of a portion of the substrate that is etched by the silicon etching step are alternately repeated, and
wherein in the repeating step, the convex portions are formed in a plurality of lines along the first surface on the side surface.

8. The method of manufacturing an element chip of claim 6,
wherein the protection film is a film including mainly fluorocarbon.

9. The method of manufacturing an element chip of claim 8,
wherein protection film forming gas for generating the second plasma contains fluorocarbon.

10. The method of manufacturing an element chip of claim 6,
wherein a film thickness of the protection film covering one or more of the convex portions is greater than a film thickness of the protection film in an intermediate portion of the adjacent two convex portions.

11. An element chip comprising:
a first surface having element regions;
a second surface on a side opposite to the first surface; and
a side surface connecting the first surface and the second surface,
wherein a plurality of convex portions are formed on the side surface and at least the convex portions of the side surface are covered by a protection film, and
wherein a film thickness of the protection film covering one or more of the convex portions is greater than a film thickness of the protection film in an intermediate portion of the adjacent two convex portions.

12. The element chip of claim 11,
wherein the convex portions are formed in a plurality of lines along the first surface on the side surface.

13. The element chip of claim 11,
wherein the protection film is a film including mainly fluorocarbon.

* * * * *